(12) United States Patent
Marzaki

(10) Patent No.: US 11,538,941 B2
(45) Date of Patent: Dec. 27, 2022

(54) INTEGRATED CAPACITIVE ELEMENT AND CORRESPONDING PRODUCTION METHOD

(71) Applicant: STMicroelectronics (Rousset) SAS, Rousset (FR)

(72) Inventor: Abderrezak Marzaki, Aix en Provence (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 67 days.

(21) Appl. No.: 17/196,226

(22) Filed: Mar. 9, 2021

(65) Prior Publication Data
US 2021/0288189 A1 Sep. 16, 2021

(30) Foreign Application Priority Data

Mar. 16, 2020 (FR) ...................................... 2002552

(51) Int. Cl.
*H01L 29/94* (2006.01)
*H01L 27/11531* (2017.01)
(Continued)

(52) U.S. Cl.
CPC ........ *H01L 29/945* (2013.01); *H01L 27/0921* (2013.01); *H01L 27/11531* (2013.01);
(Continued)

(58) Field of Classification Search
CPC ............. H01L 29/945; H01L 29/66181; H01L 29/4236; H01L 29/0619; H01L 29/66189;
(Continued)

(56) References Cited

U.S. PATENT DOCUMENTS 11,164,875 B2 * 11/2021 Marzaki ............ H01L 27/11521
2019/0067274 A1 * 2/2019 Marzaki ................ H01L 21/283
(Continued)

FOREIGN PATENT DOCUMENTS

| FR | 3070534 A1 | 3/2019 |
| FR | 3070535 A1 | 3/2019 |
| FR | 3080948 A1 | 11/2019 |

OTHER PUBLICATIONS

INPI Search Report and Written Opinion for FR 2002552 dated Dec. 3, 2020 (11 pages).

*Primary Examiner* — Jose R Diaz
(74) *Attorney, Agent, or Firm* — Crowe & Dunlevy

(57) ABSTRACT

An integrated circuit includes a first semiconductor well contained in a semiconductor substrate and a second semiconductor well contained in the first semiconductor well. A capacitive element for the integrated circuit includes a first electrode and a second electrode, where the first electrode includes at least one vertical conductive structure filling a trench extending vertically into the first semiconductor well. The vertical conductive structure is electrically isolated from the first semiconductor well by a dielectric envelope covering a base and the sides of the trench. The vertical conductive structure penetrates into the second semiconductor well at least at one longitudinal end of the trench. The second electrode includes the first semiconductor well and the second semiconductor well.

28 Claims, 4 Drawing Sheets

(51) Int. Cl.
    *H01L 29/06*    (2006.01)
    *H01L 29/66*    (2006.01)
    *H01L 27/092*   (2006.01)
    *H01L 27/118*   (2006.01)

(52) U.S. Cl.
    CPC .... *H01L 29/0619* (2013.01); *H01L 29/66189* (2013.01); *H01L 2027/1189* (2013.01)

(58) Field of Classification Search
    CPC .......... H01L 28/90–92; H01L 27/0921; H01L 27/11–11597; H01L 2027/1189
    See application file for complete search history.

(56) References Cited

U.S. PATENT DOCUMENTS

| | | | |
|---|---|---|---|
| 2020/0043936 A1* | 2/2020 | Marzaki | H01L 27/11206 |
| 2021/0167009 A1* | 6/2021 | Marzaki | H01L 21/76224 |
| 2021/0225757 A1* | 7/2021 | Marzaki | H01L 28/91 |

* cited by examiner

INTEGRATED CAPACITIVE ELEMENT AND CORRESPONDING PRODUCTION METHOD

PRIORITY CLAIM

This application claims the priority benefit of French Application for Patent No. 2002552, filed on Mar. 16, 2020, the content of which is hereby incorporated by reference in its entirety to the maximum extent allowable by law.

TECHNICAL FIELD

Embodiments and implementations relate to integrated circuits (in particular, integrated capacitive elements) and methods for producing integrated circuits.

BACKGROUND

In integrated circuits, capacitive elements are typically provided, for example, to decouple a power supply voltage. Conventionally, a Metal Oxide Semiconductor (MOS) type capacitive element is provided in this regard due to a low production cost (no step dedicated to the production thereof in addition to the steps envisaged for transistors). Indeed, conventional MOS capacitive elements have a conventional CMOS ("Complementary Metal Oxide Semiconductor") transistor planar gate structure, wherein the conductive gate region forms one electrode of the capacitive element, whereas the semiconductor region (substrate or well) forms the other electrode of the capacitive element.

That being said, the performance of conventional MOS capacitive elements is not optimal, particularly in terms of high leakage currents and a relatively low capacitive value per unit of surface area.

Moreover, it is desirable to design compatible MOS capacitive elements in accumulation mode and in inversion mode, for reasons of flexibility of use and also because inversion mode can have a superior stability in voltage of the capacitive value.

According to the N or P type of conductivity of the semiconductor substrate or of the semiconductor well wherein the capacitive element is formed, polarizing the semiconductor region can be problematic with respect to the use of the capacitive element.

For example, to bring a P-type well to a non-zero positive potential, the design rules impose positioning constraints of this well at a safety distance from the other P-type wells, typically at a mass potential. Indeed, this type of polarization can induce a conduction path via the parasitic bipolar elements formed at the interfaces of the circuit wells, according to a phenomenon usually referred to using the term "latch-up". This safety distance can be on the order of 6 µm or 12 µm, which is very bulky on the scale of integrated circuits.

It is desirable to provide more compact capacitive elements (i.e., with a higher capacitive value per unit of surface area) having little leakage, compatible with an inversion mode and being subjected to few or no design rule positioning constraints, and furthermore requiring few or no steps dedicated to the productions thereof.

SUMMARY

In this regard, according to an aspect, an integrated circuit comprises a first doped semiconductor well of a first type of conductivity contained in a semiconductor substrate. The first well contains a second doped semiconductor well of a second type of conductivity opposite to the first type of conductivity, having an annular shape defining an internal zone of the first well. The integrated circuit further comprises a capacitive element comprising a first electrode and a second electrode. The first electrode includes at least one vertical conductive structure filling a trench extending vertically into the first well, the vertical conductive structure being electrically isolated from the first well by a dielectric envelope covering the base and the sides of said trench. The vertical conductive structure penetrates into the second well at least at one longitudinal end of the trench. The second electrode includes said first well and said second well.

The second well serves as a source of minority carriers in the first well, to enable an inversion mode.

Indeed, given that the trench penetrates longitudinally into the second well, the vertical conductive structure forms a PMOS type device suitable for inducing a conduction channel region in the first well, lining the base and the sides of the dielectric envelope of the vertical conductive structure.

Furthermore, given that the second well is contained in the first well (i.e., the first well encloses the second well), the second well is isolated particularly from the semiconductor substrate and from the other P-type wells by PNP double junctions, and is consequently less, or not, subject to the "latch-up" phenomena.

Thus, the integrated capacitive element according to this aspect enables an inversion mode without being subject to positioning constraints, and has moreover a high capacitive value per unit of surface area due to the use of the depth of the well to form the capacitive interface between the first electrode and the second electrode.

According to an embodiment, the second well has an annular shape defining an internal zone and an external zone of the first well, and said at least one vertical conductive structure traverses right through the internal zone of the first well, penetrating into the second well at both longitudinal ends of the trench.

This is advantageous particularly for the formation of the conduction channel region in inversion mode, and in terms of stability in voltage of the capacitive value of the capacitive element in inversion.

According to an embodiment, the second well is positioned inside a region containing contacts whereon the elements of the first electrode and, respectively, the second electrode are electrically coupled.

Thus, envisaging the second well to particularly enable operation in inversion mode does not substantially increase the surface area occupied by the structure of the capacitive elements further envisaging the region containing the contacts for electrically coupling the elements of the first electrode, particularly the vertical conductive region, and for coupling to one another the elements of the second electrode, particularly the first well and the second well.

According to an embodiment, the base of the second well is separated vertically from the semiconductor substrate by a doped semiconductor thickness of the first conductivity type.

Indeed, it is possible to envisage a formation of the second well at a depth less than that of the first well, but it can be preferable to carry out an additional implantation of a deep buried semiconductor layer in the substrate, forming said semiconductor thickness vertically separating the base of the second well and the substrate, for example for reasons of pooling of production steps, and optionally of dopant diffusion control.

According to an embodiment, the second type of conductivity is the "P" positive type.

According to an embodiment, the first type of conductivity is the "P" positive type.

According to an embodiment, the semiconductor substrate is "P" positive-type doped.

According to an embodiment, the vertical conductive structures, the dielectric envelope, the first well, and the second well are mutually arranged to respectively form a gate region of a metal-oxide-semiconductor "MOS" type transistor, a dielectric gate region of the MOS transistor, the semiconductor body of the MOS transistor and at least one conduction terminal of the MOS transistor.

According to an embodiment, the first electrode further includes a first horizontal conductive structure resting on a first dielectric layer covering the first well and covering said at least one vertical conductive structure, so as to electrically isolate the first horizontal conductive structure from the first well and from said at least one vertical conductive structure.

This embodiment makes it possible to add an additional capacitive interface between the first electrode and the second electrode, for the same occupied surface area on the substrate. This makes it possible to increase the capacitive value per unit of surface area of the capacitive element.

And, for example, the second electrode can further include a second horizontal conductive structure resting on a second dielectric layer covering the first horizontal conductive structure so as to electrically isolate the second horizontal conductive structure from the first horizontal conductive structure.

Here again, an additional capacitive interface is added between the first electrode and the second electrode, for an unchanged occupied surface area on the substrate, in order to further increase the capacitive value per unit of surface area of the capacitive element.

According to an embodiment, the integrated circuit further includes a logic part configured to be powered with a non-zero positive logic level power supply voltage, and the capacitive element is configured to be polarized in an inversion mode, with a first voltage on the first electrode, for example a ground reference voltage, and a second voltage greater than or equal to the first voltage and less than or equal to the logic level power supply voltage, for example, the logic level power supply voltage, on the second electrode.

In other words, the high level voltage inducing an inversion mode on the second electrode is limited by the logic level, in order to strictly prevent "latch-up" parasitic bipolar effects. Thus, highly permissive positioning constraints are obtained (i.e., a small, or even minimal, safety distance) and this is advantageous in terms of size and flexibility of design of the integrated circuit.

According to a further aspect, a method for producing an integrated circuit, including a production of a capacitive element having a first electrode and a second electrode, comprises: forming a first doped semiconductor well of a first type of conductivity contained in a semiconductor substrate; forming a second doped semiconductor well of a second type of conductivity opposite to the first type of conductivity, contained in the first well and having an annular shape defining an internal zone of the first well; forming at least one vertical conductive structure, comprising: formation of, respectively, at least one trench extending vertically into the first well and penetrating into the second well at least at one longitudinal end, formation of a dielectric envelope covering the base and the sides of said at least one trench, and formation of a vertical conductive structure filling said at least one trench and being electrically isolated from the first well by the dielectric envelope; electrically coupling the first electrode comprising formation of contacts on the vertical conductive structure; and electrically coupling the second electrode comprising formation of contacts on the first well and on the second well.

According to an implementation, the method further comprises: forming the second well having an annular shape defining an internal zone and an external zone of the first well, and forming said at least one vertical conductive structure traversing right through the internal zone of the first well and penetrating into the second well at both longitudinal ends of the trench.

According to an implementation, the second well is positioned inside a region containing contacts whereon the elements of the first electrode and, respectively, the second electrode are electrically coupled is formed.

According to an implementation, forming the second well contained in the first well comprises forming a doped semiconductor thickness of the first type of conductivity vertically separating the second well from the semiconductor substrate.

According to an implementation, the second type of conductivity is the "P" positive type.

According to an alternative implementation, the first type of conductivity is the "P" positive type.

According to an implementation, the semiconductor substrate is "P" positive-type doped.

According to an implementation, the forming of the vertical conductive structure, the dielectric envelope, the first well, and the second well are mutually arranged to respectively form a gate region of a metal-oxide-semiconductor "MOS" type transistor, a dielectric gate region of the MOS transistor, the semiconductor body of the MOS transistor and at least one conduction terminal of the MOS transistor.

According to an implementation, the method further comprises: forming a first dielectric layer covering the first well and covering said at least one vertical conductive structure; forming a first horizontal conductive structure resting on the first dielectric layer and electrically isolated from the first well and from said at least one vertical conductive structure by the first dielectric layer; wherein electrically coupling the first electrode further comprises forming contacts on the first horizontal conductive structure.

According to an implementation, the method further comprises: forming a second dielectric layer covering the first horizontal conductive structure; forming a second horizontal conductive structure resting on the second dielectric layer and electrically isolated from the first horizontal conductive structure by the second dielectric layer; wherein electrically coupling the second electrode further comprises forming contacts on the second horizontal conductive structure.

According to an implementation, the method further comprises producing a logic part in the semiconductor substrate, with a power supply of the logic part at a non-zero positive logic level power supply voltage, wherein the capacitive element is polarized in an inversion mode, with a first voltage on the contact of the first electrode and a second voltage greater than the first voltage and less than or equal to the logic level power supply voltage, on the contact of the second electrode.

According to an implementation, the method further comprises producing a high-voltage part and a non-volatile memory in the semiconductor substrate, wherein: forming the first well is carried out simultaneously with forming doped semiconductor wells of the first type of conductivity in the high-voltage part; forming the second semiconductor well is carried out simultaneously with forming doped semiconductor wells of the second type of conductivity in the high-voltage part; and forming at least one vertical conductive structure is carried out simultaneously with forming vertical-gate buried transistors in the non-volatile memory.

According to an implementation, the forming of the doped semiconductor thickness of the first type of conductivity vertically separating the second well from the semiconductor substrate is carried out simultaneously with forming of source regions of said vertical-gate buried transistors in the non-volatile memory, comprising forming a doped buried semiconductor region of the first type of conductivity deep in the substrate.

According to an implementation: forming the first dielectric layer is carried out simultaneously with forming a tunnel dielectric layer of floating gate state transistors in the non-volatile memory, covering a surface of the semiconductor substrate; and forming the first horizontal conductive structure is carried out simultaneously with forming a floating gate of the state transistors resting on the tunnel dielectric layer in the non-volatile memory.

According to an implementation: forming the second dielectric layer is carried out simultaneously with forming a gate dielectric layer of the floating gate state transistors in the non-volatile memory covering a surface of the semiconductor substrate; and forming the second horizontal conductive structure is carried out simultaneously with forming a control gate of the state transistors resting on the gate dielectric layer in the non-volatile memory.

BRIEF DESCRIPTION OF THE DRAWINGS

Further advantages and features of the invention will emerge on studying the detailed description of embodiments and implementations, in no way restrictive, and of the appended drawings wherein.

DETAILED DESCRIPTION

Figure 1:
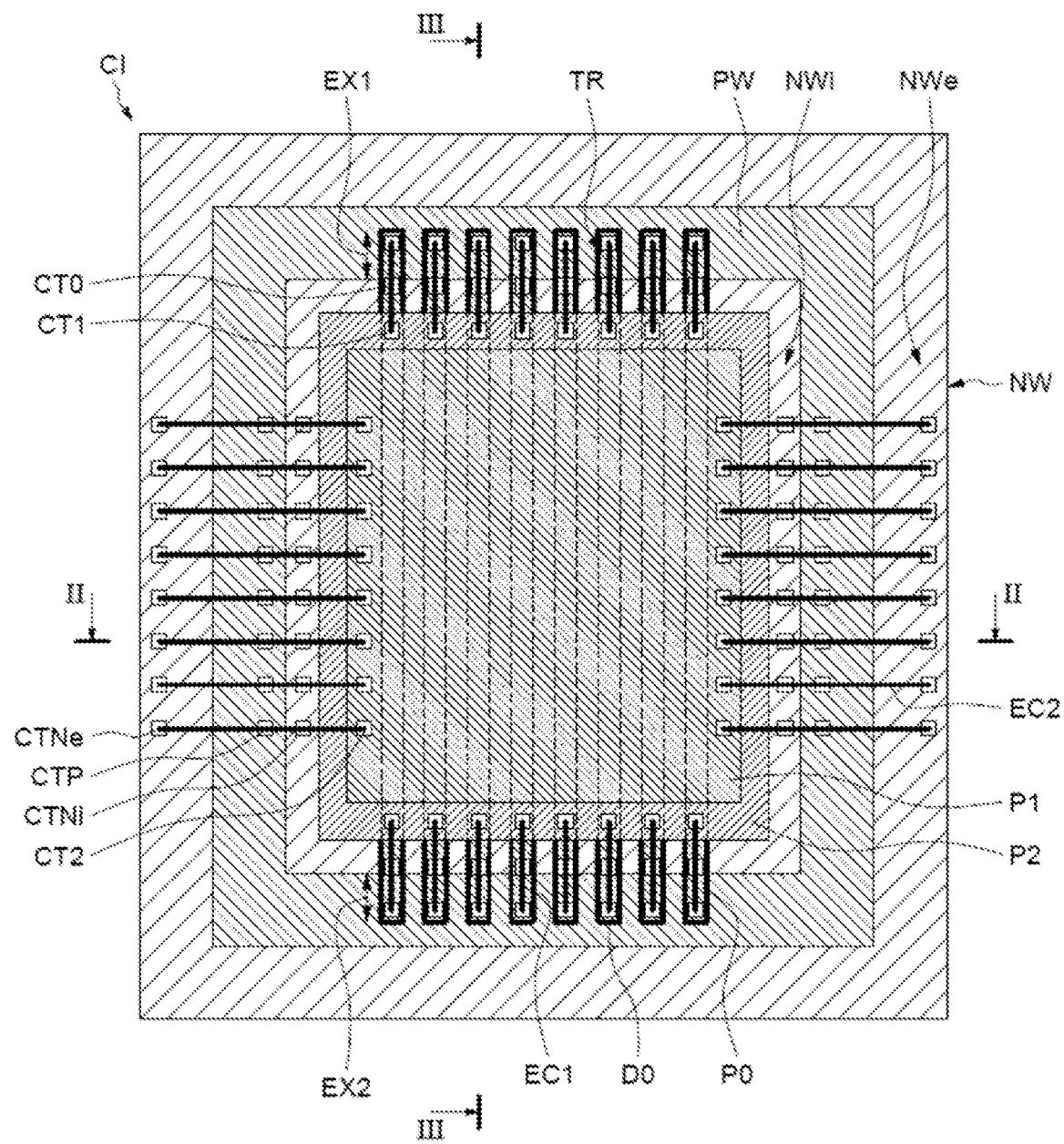
FIG. 1 represents a top view of a capacitive element of an integrated circuit.
Figure 2:
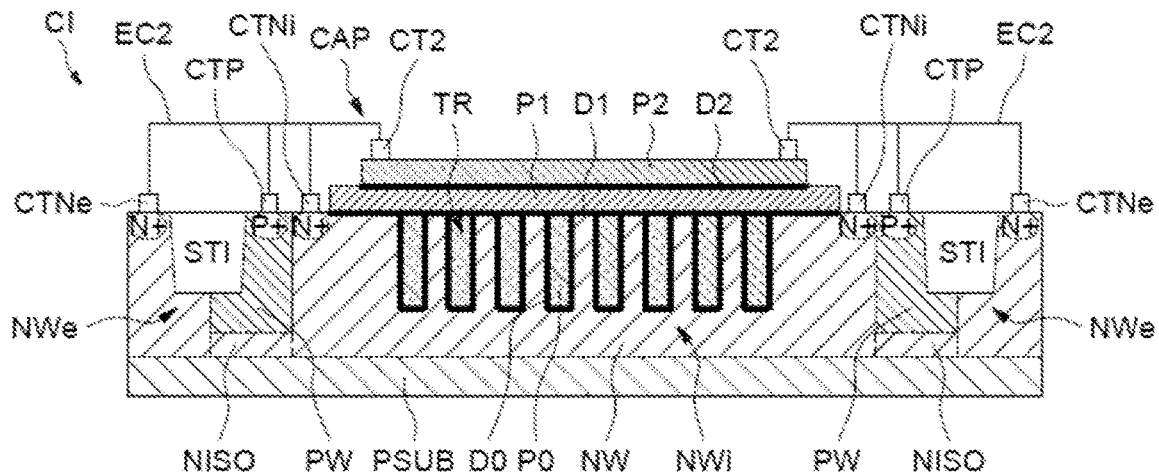
FIGS. 2 and 3 are sectional views of the capacitive element of FIG. 1.
Figure 3:
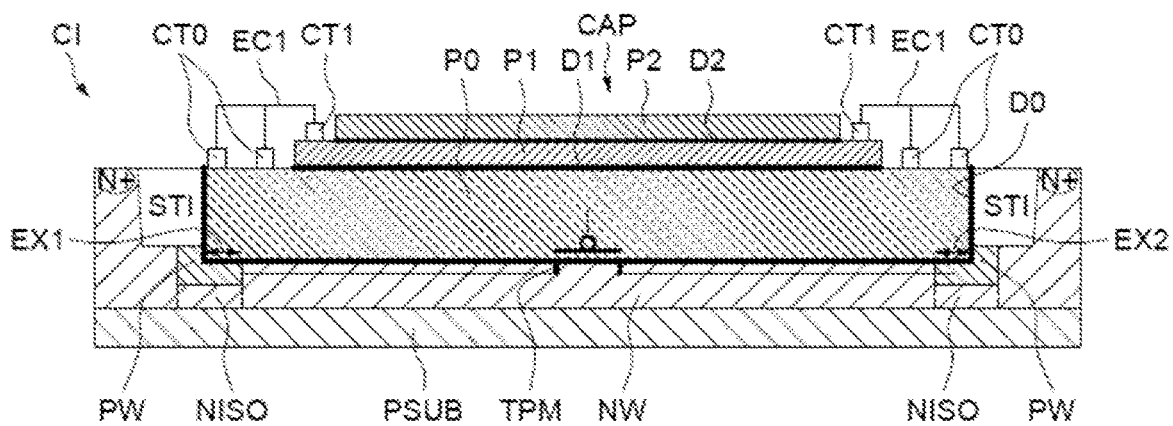

FIG. 1 represents a top view of a capacitive element CAP of an integrated circuit CI, FIG. 2 represents a sectional view of the capacitive element CAP in the plane II-II in FIG. 1, and FIG. 3 represents a sectional view of the capacitive element CAP in the plane in FIG. 1.

The same elements represented in the views in FIGS. 1, 2 and 3 bear the same references, and FIGS. 1, 2 and 3 will now be described jointly and indistinctly.

The integrated circuit CI is produced from a doped semiconductor substrate PSUB, for example of silicon, of a type of conductivity, for example P-type.

A first doped semiconductor well NW of a first type of conductivity, for example N-type, is produced in the substrate PSUB, for example by conventional dopant implantation.

A second doped well PW of a second type of conductivity opposite to the first type of conductivity, for example P-type, is formed in the first well NW so as to be contained in the first well NW. This means that the second well PW is encompassed by the first well NW, so as to be electrically isolated from the other semiconductor regions of the second type of conductivity (such as the substrate PSUB) by PNP double junctions.

For reasons of conciseness, the first type of conductivity will hereinafter be referred to as N-type, and the second type of conductivity as P-type.

That being said, the capacitive element CAP described hereinafter may perfectly be produced from semiconductor wells envisaged with inverse conductivities to the conductivities described herein by way of non-limiting example.

Thus, the first type of conductivity can be the "P" positive type, whereas the second type of conductivity can be the "N" negative type.

The type of conductivity of the substrate PSUB, though typically almost always P-type, could optionally be N-type.

In this example, the second well PW is produced according to a square annular shape, visible in the top view in FIG. 1. The annular shape thus defines an internal zone NWi of the first well NW, and an external zone NWe of the first well NW. Obviously, the internal and external orientations of the zones of the first well NWi, NWe are defined by the inward and respectively outward radial directions of the annular shape.

The semiconductor region of the second well PW does not join the substrate PSUB. Indeed, the sides of the second well PW face the external zone of the first well NWe, whereas the base of the second well PW is vertically separated from the semiconductor substrate PSUB by an N-type doped semiconductor thickness NISO.

The semiconductor thickness NISO makes it possible to electrically isolate the second well PW from the substrate PSUB. Indeed, as seen hereinafter, the second well PW will be polarized at a different voltage to the substrate PSUB.

In the case where the second well is N-type and the substrate is P-type, the semiconductor layer NISO of the opposite type of conductivity to the type of conductivity of the second well, is optional.

For example, the implantation of the P-type dopants forming the second well PW is configured such that the dopants do not diffuse in depth to the substrate PSUB.

That being said, for reasons of dopant diffusion control and of pooling of production method steps, it is preferable to carry out an additional implantation of a buried semiconductor layer NISO (i.e., located at a depth of the substrate) to form said semiconductor thickness NISO vertically separating the base of the second well PW and the substrate PSUB.

The capacitive element CAP is of the MOS "Metal Oxide Semiconductor" type given that it comprises a first electrode EC1 including a conductive structure P0, and a second electrode EC2 including particularly the first semiconductor well NW.

The first electrode EC1 and the second electrode EC2 are electrically separated by a dielectric material D0 forming a capacitive interface.

The first electrode EC1 indeed includes at least one vertical conductive structure P0 filling a trench TR extending vertically into the first well NW. "Filling a trench"

generally denotes that the internal volume of the trench does not include material other than the vertical conductive structure.

The base and the sides of the trench TR are nonetheless covered with a dielectric envelope D0, electrically isolating the vertical conductive structure P0 filling the internal volume of the trench TR, and the first well NW.

The trench TR is formed by a dry etching according to the pattern of a mask, and the pattern of this etching is configured such that least at one longitudinal end EX1, EX2 of the trench TR penetrates into the second well PW, from the internal zone NWi of the first well.

In this example, the trench TR and therefore said at least one vertical conductive structure P0 traverses right through the internal zone of the first well NWi, and penetrates into the second well PW at both longitudinal ends EX1, EX2 of the trench TR.

Obviously, the greater the number of vertical conductive structures P0, D0, the greater the surface area of the capacitive interface between the first electrode EC1 and the second electrode EC2 (i.e., particularly the first well NW), and the greater the capacitive value per unit of surface area. Indeed, most of the surface area of the capacitive interface of the vertical conductive structures P0 extends vertically into the depth of the well NW, and very little on the surface of the well NW.

Contacts CT0 of the first electrode EC1 are produced on the vertical conductive structures P0 of all of the trenches, to electrically couple them particularly with one another (not shown). The first electrode EC1 thus formed includes all the vertical conductive structures P0.

For example, the contacts CT0 are produced at the two longitudinal ends EX1, EX2 of the vertical conductive structures P0, at the level of the ring of the second well PW and at the level of the edge of the internal zone NWi of the first well NW.

Contacts CTNi of the second electrode EC2 are produced on the first well NW, in the internal zone NWi, and contacts CTNe are produced on the external zone of the first well NWe. Furthermore, contacts CTP of the second electrode EC2 are produced on the second well PW.

The second electrode EC2 thus formed includes the first well NW (internal zone NWi and external zone NWe) and the second well PW.

The second well PW will serve as a source of minority carriers in the first well NW, to enable an inversion mode of the capacitive element CAP.

Indeed, given that the trench TR penetrates longitudinally into the second well PW, the vertical conductive structure P0 and the dielectric envelope D0 form a structure TPM comparable to a PMOS type transistor.

Thus, positively polarizing the second electrode EC2 with respect to the first electrode EC1 induces a P-type conduction channel region which lines the base and the sides of the dielectric envelope D0 of the trench TR, in the first N-type well NW.

The inversion mode in the N-type well NW is advantageous particularly in terms of stability of the capacitive value with respect to the voltage at the terminals EC1, EC2 of the capacitive element CAP, particularly with respect to an accumulation mode of an MOS type capacitive element of comparable structure, in a P-type well.

Furthermore, the capacitive element CAP is protected against parasitic bipolar element leakage ("latch-up") phenomena, given that the P-type second well PW is isolated particularly from the P-type semiconductor substrate PSUB and any other P-type wells by PNP double junctions formed with the first well NW.

Bringing the first well NW to a positive potential does not typically introduce a particular positioning constraint.

Thus, in inversion mode, the capacitive element CAP is subject to little or no positioning constraints, and has moreover a high capacitive value per unit of surface area due to the use of the depth of the well NW to form the capacitive interface between the first electrode EC1 and the second electrode EC2.

Furthermore, the capacitive element CAP advantageously includes two additional horizontal capacitive interfaces, obtained by horizontal conductive structures P1, P2, comparable to a planar transistor double gate structure, stacked on top of the first well NW and the trenches TR filled with the vertical conductive structure P0.

Thus, the first electrode EC1 advantageously further includes a first horizontal conductive structure P1 resting on a first dielectric layer D1. The horizontal conductive structure P1 and the first dielectric layer D1 cover the first well NW and cover said at least one vertical conductive structure P0. The horizontal conductive structure P1 is thus electrically isolated from the first well NW forming an additional capacitive interface with the first well NW belonging to the second electrode EC2. The first dielectric layer D1 electrically isolates the first horizontal conductive structure P1 from the vertical conductive structures P0 of the trenches TR. That being said, the first horizontal conductive structures P1 and the vertical conductive structures P0 belong to the first electrode EC1, and are in this regard electrically coupled to one another by contacts CT1 on the first horizontal conductive structure P1, and by contacts CT0 coupled with the vertical conductive structures P0.

Furthermore, the second electrode EC2 advantageously includes a second horizontal conductive structure P2 resting on a second dielectric layer D2 which covers most of the first horizontal conductive structure P1. The second horizontal conductive structure P2 and the first horizontal conductive structure P1 are thus electrically isolated and form an additional capacitive interface between the first electrode EC1 and the second electrode EC2. The second electrode EC2 is electrically coupled with the second horizontal conductive structure P2 on contacts CT2 coupled with the contacts CTNi, CTNe, on the first well NW and with the contacts CTP on the second PW.

Thus, two additional capacitive interfaces have been added between the first electrode EC1 and the second electrode EC2, for the same occupied surface area on the substrate PSUB (i.e. on the surface of the well NW). This makes it possible to increase the capacitive value per unit of surface area of the capacitive element CAP.

Indeed, as will be seen hereinafter with reference to FIG. 6, the steps of producing the first conductive structure P1 and the second conductive structure P2 can advantageously be pooled in steps of producing a non-volatile memory, and are thus free.

Moreover, a peripheral region of the capacitive element CAP is envisaged to produce the contacts CTNe, CTNi, CTP, CT2 to electrically couple the elements NWe, NWi, PW, P2, of the second electrode EC2, and to produce the contacts CT0, CT1 of the elements P0, P1 of the first electrode EC1.

And, the annular shape of the second well PW is an advantageous embodiment example making it possible particularly to position the surface area occupied by the second well PW inside the surface area envisaged for the peripheral region containing the embodiments of said contacts. Optionally, the second well can be positioned so as to intersect at least a part of the surface area envisaged for the peripheral region containing the contacts.

Moreover, even in a case where the horizontal conductive structures P1, D1, P2, D2 are not envisaged, a peripheral region should nonetheless be envisaged to contain the contacts CT0, CTNi, CTNe, CTP making it possible particularly to electrically couple the first electrode EC1 and the second electrode EC2 of the capacitive element CAP with for example external terminals.

Further shapes of the second well PW can obviously be envisaged to position the second well PW at least partially inside the surface area envisaged for the region containing the contacts, particularly according to the position chosen for said contacts.

Thus, the second well PW introduces little or no additional surface area dedicated to the production thereof on the substrate PSUB.

Figure 4:
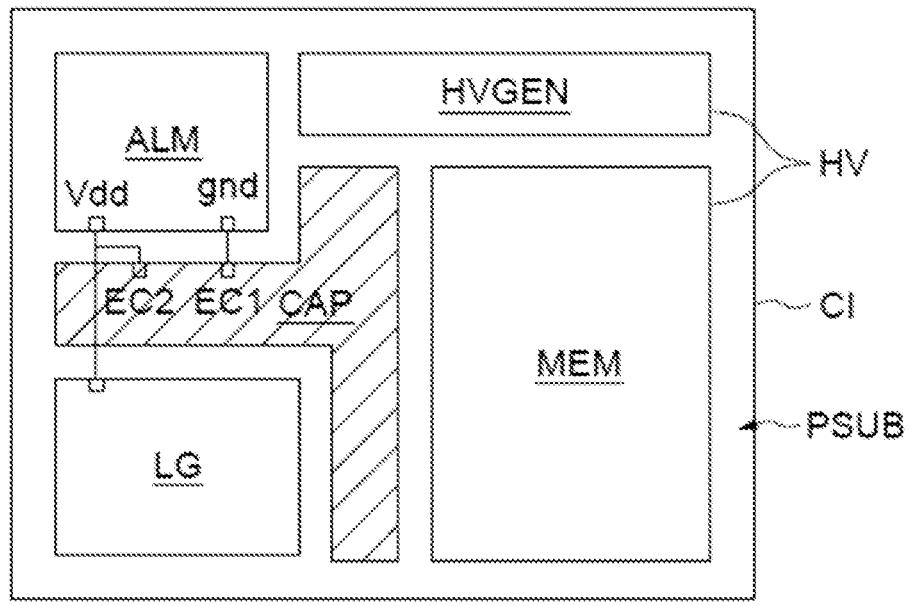
FIG. 4 represents a schematic example of architecture of an application of the integrated circuit.

Reference is now made to FIG. 4.

FIG. 4 represents a schematic example of architecture of an application of the integrated circuit CI, wherein the integrated circuit further includes the capacitive element CAP, in and on the same substrate PSUB, a logic part LG, a power supply stage ALM and a high-voltage part HV including a non-volatile memory MEM and a high-voltage signal generator HVGEN. The high-voltage signals are for example of the order of 10 to 15 volts.

The capacitive element CAP, benefitting from non-restrictive positioning rules on the substrate PSUB, is disposed so as to fill the remaining surface area available between the other elements LG, HVGEN, MEM, ALM of the integrated circuit CI. Thus, the integrated circuit CI is relatively compact despite the surface area occupied by the capacitive element CAP.

The logic part LG is configured to be powered at a non-zero positive logic level power supply voltage Vdd, and the capacitive element CAP is used as a decoupling capacitor between the logic level voltage Vdd and a ground reference voltage gnd.

The capacitive element CAP is advantageously polarized in inversion mode (i.e., with the ground reference voltage gnd on the first electrode EC1 and with the logic level power supply voltage Vdd on the second electrode EC2).

Figure 5:
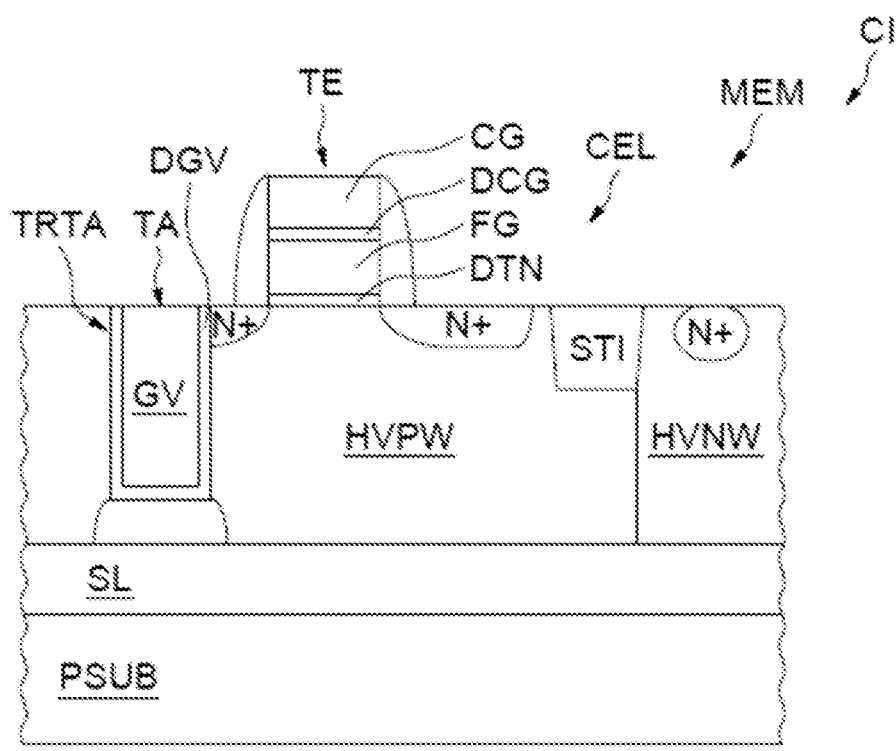
FIG. 5 is a sectional view of a memory cell.

FIG. 5 represents an advantageous example of a memory cell CEL belonging to the non-volatile memory MEM of the integrated circuit CI described above with reference to FIG. 4.

The memory cell CEL is formed in and on a P-type doped well HVPW contained in the substrate PSUB. Under the well HVPW, an N-type doped buried semiconductor region SL is located at a depth of the substrate PSUB. The buried semiconductor region SL forms a source plane acting as a source line. An N-type doped semiconductor region HVNW, extends from the top face of the well HVPW to the buried semiconductor region SL, forming a contact well suitable for polarizing the source line SL via said top face.

The memory cell CEL includes an access transistor TA in series with a state transistor TE. The access transistor TA is a vertical gate buried transistor, and has a conductive gate GV filling a trench TRTA, the base and the sides of the trench TRTA being covered with a vertical gate dielectric layer DGV encasing the vertical conductive gate GV. The source region of the access transistor TA is materialized by the source plane SL, and optionally an N-type semiconductor region implanted or diffused in the base of the trench TRTA.

The state transistor TE is, for its part, a floating gate transistor including a floating gate FG electrically isolated from the well HVPW by a so-called "tunnel" dielectric layer DTN, and a control gate CG electrically isolated from the floating gate by a so-called control gate dielectric layer DCG.

Figure 6:
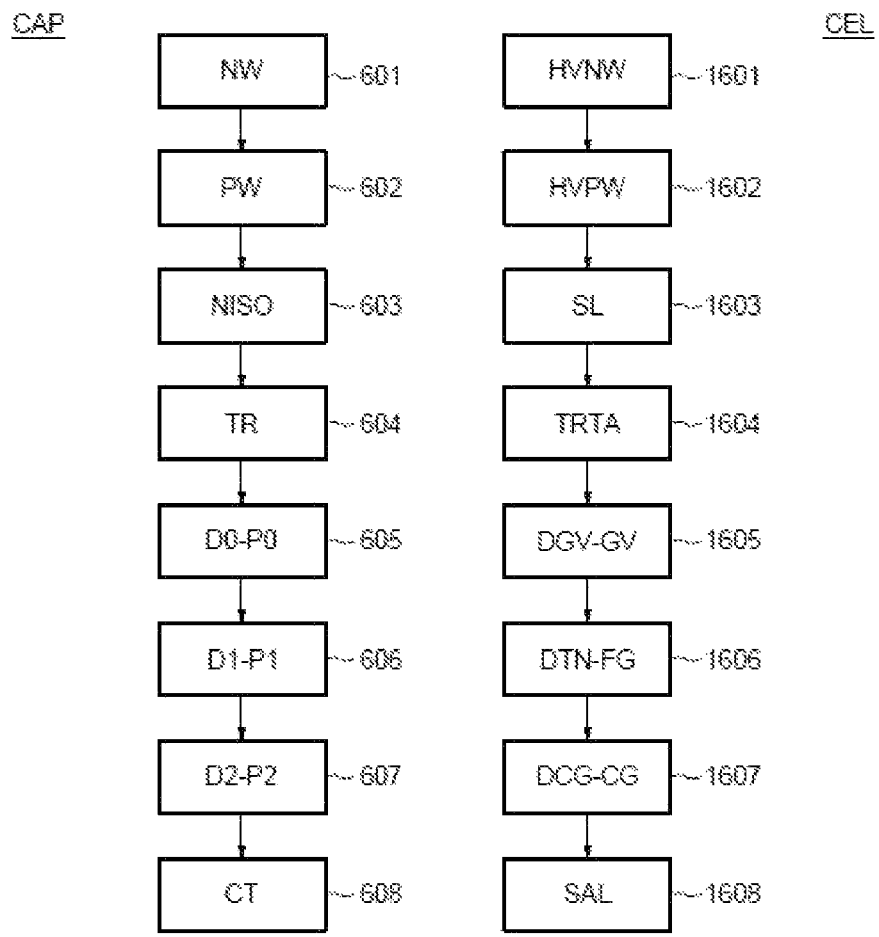
FIG. 6 illustrates schematically steps of a method for producing, on the left side, the capacitive element CAP described above with reference to FIGS. 1 to 4 and, on the right side, the memory cell CEL described above with reference to FIG. 5.

Reference is now made to FIG. 6.

FIG. 6 illustrates schematically, on one hand, steps of a method for producing the capacitive element CAP described above with reference to FIGS. 1 to 4, on the left in the representation of FIG. 6; and, on the other, steps of producing the memory cell CEL described above with reference to FIG. 5, on the right in the representation in FIG. 6.

The formation step 601 of the first well NW of the capacitive element CAP can advantageously be carried out simultaneously with a formation step 1601 of the N-type doped semiconductor wells HVNW in the high-voltage part HV, such as the contact wells of the memory MEM.

The steps 601, 1601 comprise, for example, a common implantation of N-type dopants through the pattern of a mask formed on the top face of the substrate PSUB, and at a concentration enabling an operation at voltages of the order of 10 to 15 volts.

The formation step 602 of the second well PW of the capacitive element CAP can advantageously be carried out simultaneously with a formation step 1602 of the P-type doped semiconductor wells HVPW in the high-voltage part HV, particularly in the memory MEM.

The steps 602, 1602 comprise, for example, a common implantation of P-type dopants through the pattern of a mask formed on the top face of the substrate PSUB, and at a concentration enabling an operation at voltages of the order of 10 to 15 volts.

The formation step 603 of the N-type doped semiconductor thickness NISO vertically separating the second well PW from the semiconductor substrate PSUB for the capacitive element CAP can advantageously be carried out simultaneously with the formation step 1603 of the source plane SL of the memory MEM.

The steps 603, 1603 comprise, for example, a common implantation of N-type dopants in the entire region of the substrate PSUB comprising the capacitive element CAP and the entire region of the substrate PSUB comprising the memory MEM. The implantation 603, 1603 is configured at an energy resulting in a diffusion limited in the substrate PSUB, so as to locate the buried semiconductor region at a depth of the substrate PSUB.

For example, after the implantations 601-1601, 602-1602, and optionally 603-1603, a formation of conventional lateral shallow trench isolation regions STI (see, FIGS. 2-3 and 5) can be envisaged simultaneously for the capacitive element CAP and for the high-voltage part HV.

The formation step 604 of the trenches TR of the capacitive element CAP can advantageously be carried out simultaneously with the formation step 1604 of the trenches TRTA of the access transistors TA of the memory MEM.

The steps 604, 1604 comprise, for example, a common dry etching, for example using a reactive ion etching (RIE) technique through a common photolithographed mask.

The formation step 605 of the vertical conductive structure P0, encased in the dielectric envelope D0 in said trenches TR of the capacitive element CAP can advantageously be carried out simultaneously with the formation step 1605 of the vertical gate region GV and of the vertical gate dielectric layer DGV of the access transistor TA of the memory MEM.

The steps 605, 1605 comprise, for example, firstly a thermal growth of a silicon oxide layer on the sides and the base of the trenches TR, TRTA etched in the common steps 604, 1604; and secondly a filling to excess with the same conductive material P0, GV, for example in-situ doped polycrystalline silicon formed by chemical vapor deposition (CVD), followed by a chemical-mechanical planarization (CMP), for example, to an optional previously deposited stop layer, or by the top surface of the wells NW, HVPW.

The formation step 606 of the first horizontal conductive structure P1 resting on the first dielectric layer D1 of the capacitive element CAP can advantageously be carried out simultaneously with the formation step 1606 of the floating gate FG resting on the tunnel dielectric layer DTN of the state transistors TE of the memory MEM.

The steps 606, 1606 comprise, for example, firstly a common growth of a silicon oxide layer on the top faces of the wells NW, HVPW, an optional partial etching of a tunnel window in the tunnel dielectric layer DTN thus grown; secondly, a common CVD deposition of conductive polycrystalline silicon, followed by an optional common CMP polishing; and thirdly, a dry etching masked by photolithography to define the respective conductive regions.

The formation step 607 of the second horizontal conductive structure P2, resting on the first dielectric layer D2 of the capacitive element CAP can advantageously be carried out simultaneously with the formation step 1607 of the control gate CG resting on the control gate dielectric layer DCG of the state transistors TE of the memory MEM.

The steps 607, 1607 comprise, for example, firstly a common formation of an overlay of layers of oxide, nitride, and oxide of silicon "ONO" on the first horizontal conductive structure P1 and on the floating gate FG; secondly, a common CVD deposition of conductive polycrystalline silicon, followed by an optional common CMP polishing; and thirdly, a dry etching masked by photolithography to define the respective conductive regions.

The formation step 608 of all the contacts CT (i.e., the contacts CTNi, CTNe, CTP, CT2 of the second electrode EC2, and the contacts CT0, CT1 of the first electrode EC1 of the capacitive element CAP) can advantageously be carried out simultaneously with the contact region formation step 1608 particularly in the memory MEM but also envisaged conventionally for other elements of the integrated circuit CI.

The steps 608, 1608 comprise, for example, after implantations of high-concentration P-type dopants (P+) on the surface of the P-type wells, and implantations of high-concentration N-type dopants (N+) on the surface of the N-type wells, a siliciding step SAL for reducing access resistances to the highly doped regions P+, N+, and finally a formation of contacts, typically made of tungsten, on the silicided surfaces.

The siliciding step typically comprises a siliciding reaction SAL of exposed silicon surfaces, particularly of highly doped silicon and polycrystalline silicon, with a metallic material.

Thus, all the steps 601-608 of the method for producing the integrated capacitive element CAP can be executed simultaneously with steps 1601-1608, further envisaged to produce a high-voltage part HV of the integrated circuit including in particular a non-volatile memory MEM as described with reference to FIG. 5.

The method for producing the capacitive element CAP can thus be entirely free.

The invention claimed is:

1. An integrated circuit, comprising:
   a first doped semiconductor well of a first type of conductivity contained in a semiconductor substrate;
   a second doped semiconductor well of a second type of conductivity opposite to the first type of conductivity, said second doped semiconductor well contained in the first doped semiconductor well; and
   a capacitive element comprising a first electrode and a second electrode;
   wherein the first electrode of said capacitive element includes at least one vertical conductive structure filling a trench extending vertically into the first doped semiconductor well, the vertical conductive structure being electrically isolated from the first doped semiconductor well by a dielectric envelope covering a base and sides of said trench;
   wherein said trench longitudinally extends to penetrate into the second doped semiconductor well at a first longitudinal end of the trench;
   wherein the vertical conductive structure within said trench is present at said first longitudinal end of the trench; and
   wherein the second electrode of said capacitive element includes said first doped semiconductor well and said second doped semiconductor well.

2. The integrated circuit according to claim 1, wherein the second doped semiconductor well has an annular shape defining an internal zone of the first doped semiconductor well and an external zone of the first doped semiconductor well, and wherein said at least one vertical conductive structure is present within the internal zone of the first doped semiconductor well and penetrates into the second doped semiconductor well at said first longitudinal end of the trench.

3. The integrated circuit according to claim 2, wherein said trench longitudinally extends to penetrate into the second doped semiconductor well at a second longitudinal end of the trench, said second longitudinal end of the trench being opposite said first longitudinal end of the trench, and wherein said at least one vertical conductive structure longitudinally traverses across an entirety of the internal zone of the first doped semiconductor well and penetrates into the second doped semiconductor well at both the first and second longitudinal ends of the trench.

4. The integrated circuit according to claim 2, further comprising a doped semiconductor region of the first type of conductivity vertically positioned under a base of the second doped semiconductor well, said doped semiconductor region in contact with both the internal zone of the first doped semiconductor well and the external zone of the first doped semiconductor well.

5. The integrated circuit according to claim 1, further comprising a doped semiconductor region of the first type of conductivity vertically positioned between a base of the second doped semiconductor well and the semiconductor substrate.

6. The integrated circuit according to claim 1, wherein the second type of conductivity is the "P" positive type.

7. The integrated circuit according to claim 1, wherein the first type of conductivity is the "P" positive type.

8. The integrated circuit according to claim 1, wherein the semiconductor substrate is "P" positive-type doped.

9. The integrated circuit according to claim 1, wherein the vertical conductive structure, the dielectric envelope, the first doped semiconductor well, and the second doped semiconductor well are mutually arranged to respectively form a gate region of a metal-oxide-semiconductor (MOS) transistor, a dielectric gate region of the MOS transistor, a semiconductor body of the MOS transistor and at least one conduction terminal of the MOS transistor.

10. The integrated circuit according to claim 1, wherein the first electrode further includes a first horizontal conductive structure resting on a first dielectric layer covering the first doped semiconductor well and covering said at least one vertical conductive structure, so as to electrically isolate the first horizontal conductive structure from the first doped semiconductor well and from said at least one vertical conductive structure.

11. The integrated circuit according to claim 10, wherein the second electrode further includes a second horizontal conductive structure resting on a second dielectric layer covering the first horizontal conductive structure so as to electrically isolate the second horizontal conductive structure from the first horizontal conductive structure.

12. The integrated circuit according to claim 1, further including a logic part configured to be powered with a non-zero positive logic level power supply voltage, wherein the capacitive element is configured to be polarized in an inversion mode, with a first voltage on the first electrode and a second voltage on the second electrode, wherein the second voltage is greater than or equal to the first voltage and less than or equal to the logic level power supply voltage.

13. A method for producing an integrated circuit including a capacitive element having a first electrode and a second electrode, comprising:
    forming a first doped semiconductor well of a first type of conductivity contained in a semiconductor substrate;
    forming a second doped semiconductor well of a second type of conductivity contained in the first well, said second type of conductivity being opposite to the first type of conductivity;
    forming at least one vertical conductive structure, comprising:
        forming at least one trench extending vertically into the first doped semiconductor well and penetrating into the second doped semiconductor well at least at one longitudinal end,
        forming a dielectric envelope covering a base and the sides of said at least one trench, and
        forming a vertical conductive structure filling said at least one trench and being electrically isolated from the first doped semiconductor well by the dielectric envelope;
    electrically coupling the first electrode by formation of contacts on the vertical conductive structure; and
    electrically coupling the second electrode by formation of contacts on the first doped semiconductor well and on the second doped semiconductor well.

14. The method according to claim 13, further comprising forming the second doped semiconductor well to have an annular shape defining an internal zone of the first doped semiconductor well and an external zone of the first doped semiconductor well, wherein said at least one vertical conductive structure is present within the internal zone of the first doped semiconductor well and penetrates into the second doped semiconductor well at a first longitudinal end of the trench.

15. The method according to claim 14, wherein said trench longitudinally extends to penetrate into the second doped semiconductor well at a second longitudinal end of the trench, said second longitudinal end of the trench being opposite said first longitudinal end of the trench, and wherein said at least one vertical conductive structure longitudinally traverses across an entirety of the internal zone of the first doped semiconductor well and penetrates into the second doped semiconductor well at both the first and second longitudinal ends of the trench.

16. The method according to claim 14, further comprising forming a doped semiconductor region of the first type of conductivity vertically positioned under a base of the second doped semiconductor well, said doped semiconductor region in contact with both the internal zone of the first doped semiconductor well and the external zone of the first doped semiconductor well.

17. The method according to claim 13, further comprising forming a doped semiconductor region of the first type of conductivity vertically separating the second doped semiconductor well from the semiconductor substrate.

18. The method according to claim 13, wherein the second type of conductivity is the "P" positive type.

19. The method according to claim 13, wherein the first type of conductivity is the "P" positive type.

20. The method according to claim 13, wherein the semiconductor substrate is "P" positive-type doped.

21. The method according to claim 13, wherein forming the vertical conductive structure, forming the dielectric envelope, forming the first doped semiconductor well, and forming the second doped semiconductor well are mutually arranged to respectively form a gate region of a metal-oxide-semiconductor (MOS) transistor, form a dielectric gate region of the MOS transistor, form a semiconductor body of the MOS transistor and form at least one conduction terminal of the MOS transistor.

22. The method according to claim 13, further comprising:
    forming a first dielectric layer covering the first doped semiconductor well and covering said at least one vertical conductive structure; and
    forming a first horizontal conductive structure resting on the first dielectric layer and electrically isolated from the first doped semiconductor well and from said at least one vertical conductive structure by the first dielectric layer;
    wherein electrically coupling the first electrode further comprises forming contacts on the first horizontal conductive structure.

23. The method according to claim 22, further comprising:
    forming a second dielectric layer covering the first horizontal conductive structure; and
    forming a second horizontal conductive structure resting on the second dielectric layer and electrically isolated from the first horizontal conductive structure by the second dielectric layer;
    wherein electrically coupling the second electrode further comprises forming contacts on the second horizontal conductive structure.

24. The method according to claim 13, further comprising producing a logic part in the semiconductor substrate, wherein a power supply of the logic part is at a non-zero positive logic level power supply voltage, wherein the capacitive element is polarized in an inversion mode, with a first voltage on the contact of the first electrode and a second voltage on the contact of the second electrode, wherein the second voltage is greater than the first voltage and less than or equal to the logic level power supply voltage.

25. The method according to claim 13, further comprising producing a high-voltage part incorporating a non-volatile memory in the semiconductor substrate, wherein:

forming the first doped semiconductor well is carried out simultaneously with formation of doped semiconductor wells of the first type of conductivity in the high-voltage part;
forming the second semiconductor well is carried out simultaneously with formation of doped semiconductor wells of the second type of conductivity in the high-voltage part; and
forming at least one vertical conductive structure is carried out simultaneously with formation of vertical-gate buried transistors in the non-volatile memory.

26. The method according to claim 25,
wherein forming the second doped semiconductor well contained in the first doped semiconductor well comprises forming a doped semiconductor thickness of the first type of conductivity vertically separating the second doped semiconductor well from the semiconductor substrate;
wherein forming the vertical conductive structure, forming the dielectric envelope, forming the first doped semiconductor well, and forming the second doped semiconductor well are mutually arranged to respectively form a gate region of a metal-oxide-semiconductor (MOS) transistor, form a dielectric gate region of the MOS transistor, form a semiconductor body of the MOS transistor and form at least one conduction terminal of the MOS transistor; and
wherein forming the doped semiconductor thickness of the first type of conductivity vertically separating the second doped semiconductor well from the semiconductor substrate is carried out simultaneously with formation of source regions of said vertical-gate buried transistors in the non-volatile memory, comprising formation of a doped buried semiconductor region of the first type of conductivity, deep in the substrate.

27. The method according to claim 25, further comprising:
forming a first dielectric layer covering the first doped semiconductor well and covering said at least one vertical conductive structure; and
forming a first horizontal conductive structure resting on the first dielectric layer and electrically isolated from the first doped semiconductor well and from said at least one vertical conductive structure by the first dielectric layer;
wherein electrically coupling the first electrode further comprises forming contacts on the first horizontal conductive structure;
wherein:
forming the first dielectric layer is carried out simultaneously with formation of a tunnel dielectric layer of floating gate state transistors in the non-volatile memory covering a surface of the semiconductor substrate; and
forming the first horizontal conductive structure is carried out simultaneously with formation of the floating gate of the state transistors resting on the tunnel dielectric layer in the non-volatile memory.

28. The method according to claim 27, wherein:
said forming the second dielectric layer is carried out simultaneously with formation of a gate dielectric layer of the floating gate state transistors in the non-volatile memory covering a surface of the semiconductor substrate;
forming the second horizontal conductive structure is carried out simultaneously with formation of a control gate of the state transistors resting on the gate dielectric layer in the non-volatile memory.

* * * * *